US008699782B2

(12) United States Patent
Oike et al.

(10) Patent No.: US 8,699,782 B2
(45) Date of Patent: Apr. 15, 2014

(54) COMPONENT PRESENCE/ABSENCE JUDGING APPARATUS AND METHOD

(75) Inventors: Hiroshi Oike, Chiryu (JP); Mitsutaka Inagaki, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 191 days.

(21) Appl. No.: 13/177,020

(22) Filed: Jul. 6, 2011

(65) Prior Publication Data
US 2012/0020545 A1 Jan. 26, 2012

(30) Foreign Application Priority Data

Jul. 21, 2010 (JP) ................................. 2010-164133

(51) Int. Cl.
*G06K 9/00* (2006.01)
(52) U.S. Cl.
USPC ............ 382/141; 382/167; 382/209; 382/218
(58) Field of Classification Search
USPC ........................... 382/141, 167, 209, 118, 150
See application file for complete search history.

(56) References Cited

U.S. PATENT DOCUMENTS

| 5,761,337 | A * | 6/1998 | Nishimura et al. | ............ 382/150 |
| 7,864,988 | B2 * | 1/2011 | Cho et al. | ...................... 382/115 |
| 8,281,166 | B2 * | 10/2012 | Carroll | ........................... 713/310 |
| 2003/0097617 | A1 * | 5/2003 | Goeller et al. | .................. 714/39 |
| 2004/0208114 | A1 * | 10/2004 | Lao et al. | ...................... 369/125 |
| 2004/0215689 | A1 * | 10/2004 | Dooley et al. | .................. 709/200 |
| 2005/0207655 | A1 * | 9/2005 | Chopra et al. | ................. 382/218 |
| 2006/0251293 | A1 * | 11/2006 | Piirainen et al. | ............. 382/104 |
| 2008/0298644 | A1 * | 12/2008 | Irmatov et al. | ................. 382/118 |
| 2009/0066933 | A1 * | 3/2009 | Takano et al. | .................... 356/32 |

FOREIGN PATENT DOCUMENTS

| JP | H6-204700 | 7/1994 |
| JP | H8-254501 | 10/1996 |
| JP | 2001-345600 | 12/2001 |
| JP | 2004-53369 | 2/2004 |
| JP | 2007-114843 | 5/2007 |

OTHER PUBLICATIONS

U.S. Appl. No. 13/179,745, filed Jul. 11, 2011, Oike, et al.
Office Action issued in Japanese Application No. 2010-164133 on Feb. 12, 2014 (with English translation).

* cited by examiner

*Primary Examiner* — Vu Le
*Assistant Examiner* — Aklilu Woldemariam
(74) *Attorney, Agent, or Firm* — Oblon, Spivak, McClelland, Maier & Neustadt, L.L.P.

(57) ABSTRACT

A component presence/absence judging apparatus judges the presence/absence of components through a registration step and an inspection step. The registration step includes an ante-mounting feature acquisition step, a post-mounting feature acquisition step and a classifier configuration step. At the ante-mounting and post-mounting feature acquisition steps, ante-mounting features and post-mounting features are respectively acquired from an ante-mounting image and a post-mounting image taken at each of predetermined places on an ante-mounting board and a post-mounting board. At the classifier configuration step, a classifier is configured by registering the ante-mounting features and the post-mounting features as training data to a support vector machine. Then, at the inspection step, the presence/absence of a component at each of the predetermined places on each post-mounting operation board to be inspected is judged by inputting post-mounting operation features acquired from each of the predetermined places on each post-mounting operation board to the support vector machine configured as the classifier.

10 Claims, 7 Drawing Sheets

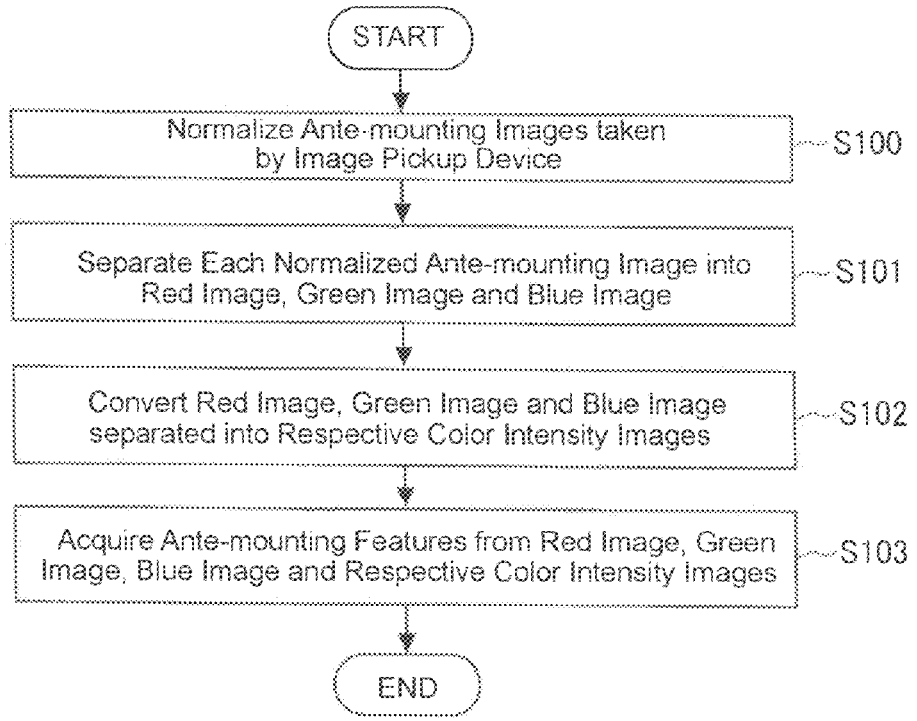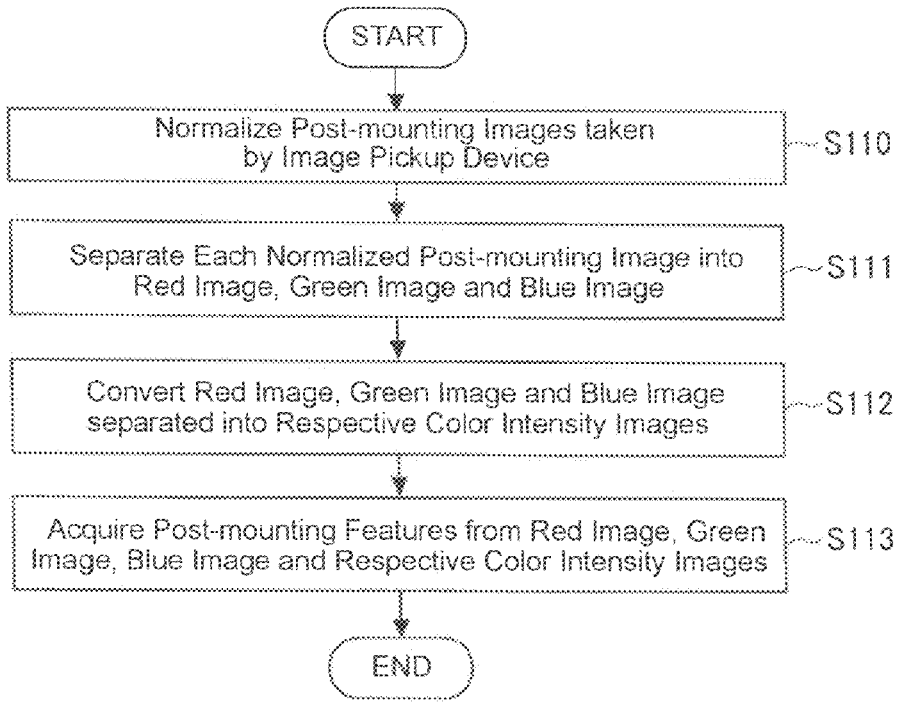

Flow Chart of
Post-mounting Operation Feature Acquisition Step S20

Flow Chart of Input Step S21

//COMPONENT PRESENCE/ABSENCE JUDGING APPARATUS AND METHOD

INCORPORATION BY REFERENCE

This application is based on and claims priority under 35 U.S.C. 119 with respect to Japanese patent application No. 2010-164133 filed on Jul. 21, 2010, the entire content of which is incorporated herein by reference.

BACKGROUND OF THE INVENTION

1. Field of the Invention

The present invention relates to a component presence/absence judging apparatus and a component presence/absence judging method for judging whether or not components are mounted at predetermined places on a board after component mounting operations.

2. Discussion of the Related Art

As component presence/absence judging apparatus and method for judging whether or not components are mounted at predetermined places on a board after component mounting operations, there have been known electronic component mounting confirmation equipment and method which are disclosed in, for example, JP2001-345600 A.

In the known equipment and method, there are detected a color indicating each of scheduled mounting places on a board before the mountings of electronic components and another color indicating each of the scheduled mounting places on the board after the mountings of the electronic components, and these colors detected are compared to confirm the mounting state of the electronic component at each of the scheduled mounting places on the board.

However, in the known equipment and method, it is carried out to detect the color at around the center part of each electronic component which part is drawn to a nozzle at the time of a mounting operation. Therefore, where the color at around the center part of each electronic component is a color which hardly differs from the color at a scheduled mounting place on the board for the mounting of each such electronic component, there occurs a possibility that the component is erroneously judged not to be mounted thought having been mounted.

SUMMARY OF THE INVENTION

Accordingly, it is an object of the present invention to provide a component presence/absence judging apparatus and a component presence/absence judging method capable of accurately judging whether or not components are mounted at predetermined places on a board after the mountings of the components.

In order to solve the foregoing problem, as a result of engaging in enthusiastic study and repeating one trial and error after another, the present inventors reached completion of the present invention through a finding that it is possible to accurately judge whether or not components are respectively mounted at predetermined places after the mountings of the components, by configuring a classifier by the use of a support vector machine and then by making use of the configured classifier in judging the presence/absence of a component at each of the predetermined places.

Herein, the term "support vector machine" means a known method of configuring a pattern classifier for two classes. The support vector machine has inputted thereto sampling or training data belonging to one class and sampling or training data belonging to the other class and determines a separation hyperplane for separating those data from each other. Then, the support vector machine classifies which class given data belongs to, on the basis of the separation hyperplane.

Briefly, according to the present invention in a first aspect, there is provided a component presence/absence judging apparatus for judging whether or not components are mounted at predetermined places on a board after component mounting operations which mount the components on the board. The apparatus comprises an image pickup device for relatively moving the board and a camera to pickup images of the predetermined places on the board; ante-mounting feature acquisition means for acquiring at least brightness information as ante-mounting features from an ante-mounting image which the image pickup device picks up at each of the predetermined places on an ante-mounting board before mounting the components at the predetermined places thereon; post-mounting feature acquisition means for acquiring at least brightness information as post-mounting features from a post-mounting image which the image pickup device picks up at each of the predetermined places on a post-mounting board after mounting the components at the predetermined places thereon; classifier configuration means for configuring a classifier by registering the ante-mounting features and the post-mounting features in a support vector machine; post-mounting operation feature acquisition means for acquiring at least brightness information as post-mounting operation features from a post-mounting operation image which the image pickup device picks up at each of the predetermined places on an inspection board after mounting the components at the predetermined places thereon; input means for inputting the post-mounting operation features to the support vector machine configured as the classifier; and judgment means for judging whether or not a component is mounted at each of the predetermined places on the inspection board, by the support vector machine configured as the classifier.

According to the present invention in a second aspect, there is provided a component presence/absence judging method for judging whether or not components are mounted at predetermined places on a board after component mounting operations which mount the components on the board. The method comprises an ante-mounting feature acquisition step of acquiring at least brightness information as ante-mounting features from an ante-mounting image which an image pickup device picks up at each of the predetermined places on an ante-mounting board before mounting the components at the predetermined places thereon; a post-mounting feature acquisition step of acquiring at least brightness information as post-mounting features from a post-mounting image which the image pickup device picks up at each of the predetermined places on a post-mounting board after mounting the components at the predetermined places thereon; a classifier configuration step of configuring a classifier by registering the ante-mounting features and the post-mounting features in a support vector machine; a post-mounting operation feature acquisition step of acquiring at least brightness information as post-mounting operation features from a post-mounting operation image which the image pickup device picks up at each of the predetermined places on an inspection board after mounting the components at the predetermined places thereon; an input step of inputting the post-mounting operation features to the support vector machine configured as the classifier; and a judgment step of judging whether or not a component is mounted at each of the predetermined places on the inspection board, by the support vector machine configured as the classifier.

With the construction in each of the first and second aspects, the classifier is configured by utilizing the support vector machine, and the configured classifier judges whether or not a component is mounted at each of the predetermined places on each inspection board. Thus, judgment of whether or not a component is mounted at each of the predetermined places on each inspection board can be made accurately after component mounting operations. Further, the support vector machine is faster to learn than neural networks or the like. Thus, it is possible to configure the classifier promptly. Accordingly, even in the case where objects to be inspected are changed, it becomes possible to proceed to judgments promptly.

BRIEF DESCRIPTION OF THE ACCOMPANYING DRAWINGS

The foregoing and other objects and many of the attendant advantages of the present invention may readily be appreciated as the same becomes better understood by reference to the preferred embodiment of the present invention when considered in connection with the accompanying drawings, wherein like reference numerals designate the same or corresponding parts throughout several views, and in which:

FIG. 5 is a further detailed flow chart showing an ante-mounting feature acquisition step in FIG. 4;

FIG. 6 is a further detailed flow chart showing a post-mounting feature acquisition step in FIG. 4;

Figure 12:
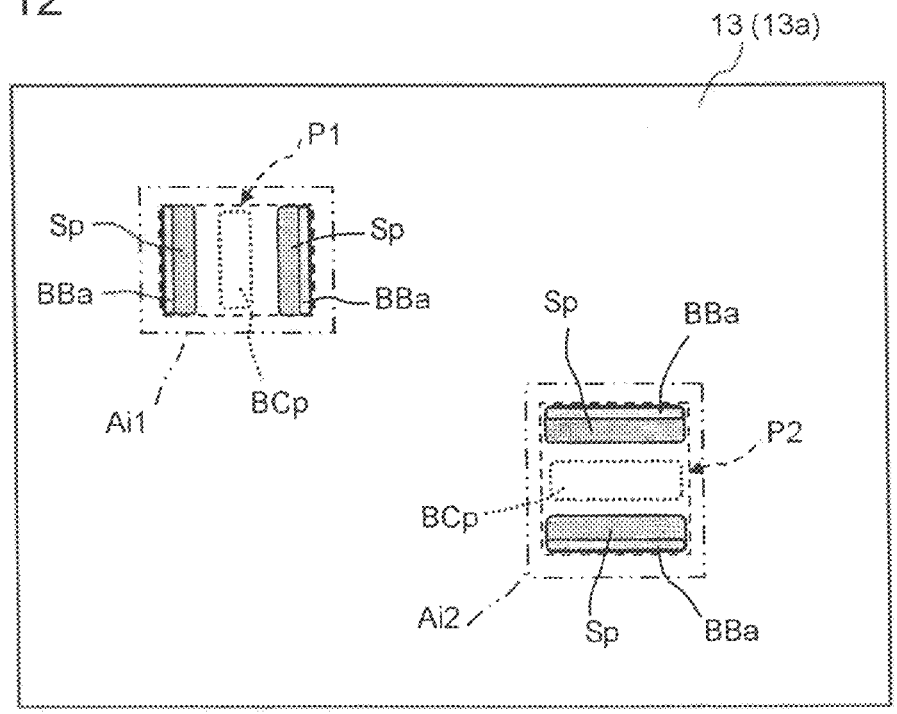
Figure 13:
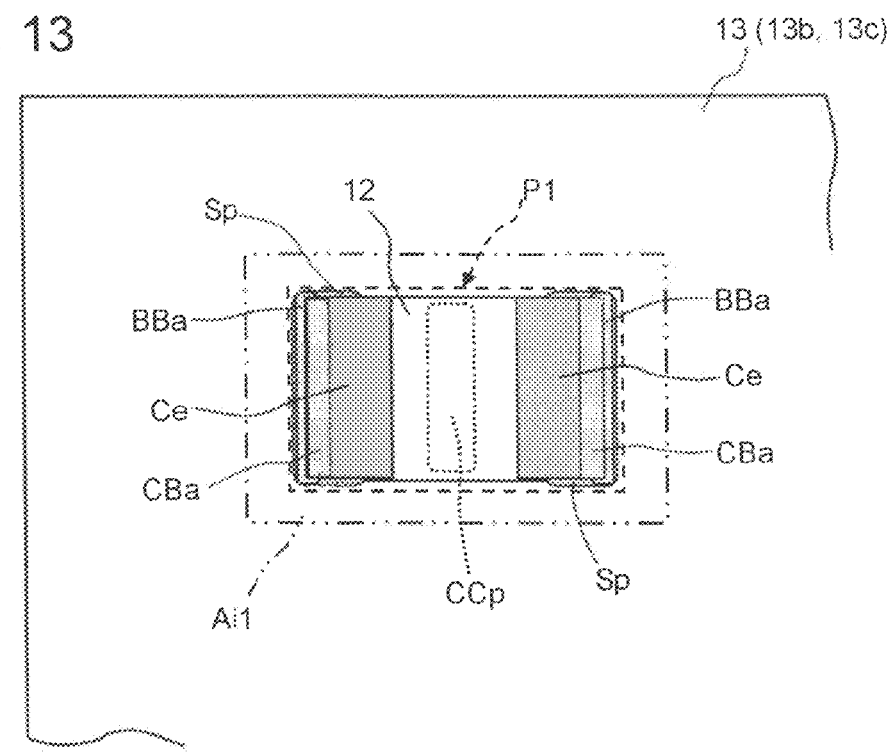

FIG. 12 is a schematic plan view of an ante-mounting board (first master board) 13a with no component mounted thereon; and FIG. 13 is an enlarged fragmentary schematic plan view common to a post-mounting board 13b and a post-mounting operation board 13c, showing a state that a component 12 is mounted on a predetermined place P1 on the boards.

DETAILED DESCRIPTION OF THE PREFERRED EMBODIMENT

Hereafter, an embodiment according to the present invention will be described with reference to the accompanying drawings. That is, with reference to FIGS. 1 through 13, the construction of a component presence/absence judging apparatus will be described together with a component presence/absence judging method implemented by the apparatus.

Figure 1:
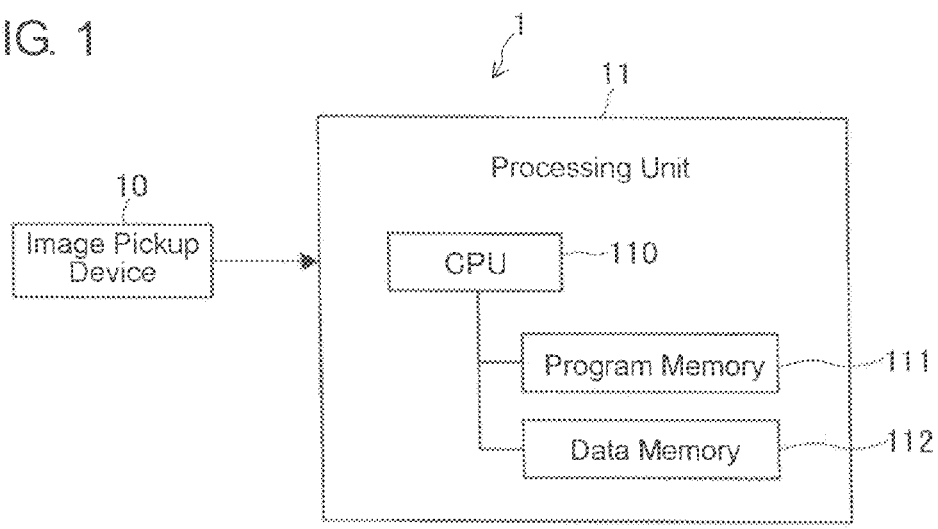
FIG. 1 is a block diagram of a component presence/absence judging apparatus for implementing a component presence/absence judging method in an embodiment according to the present invention.

The component presence/absence judging apparatus 1 shown in FIG. 1 is an apparatus for judging whether or not components are mounted at predetermined places (i.e., scheduled or programmed target places) on a post-mounting operation board (i.e., inspection board) which has completed component mounting operations for mounting components at the predetermined places. Particularly, the apparatus 1 in the present embodiment is designed for judging the presence/absence of a chip component 12 with two electrode portions Ce, Ce as schematically exemplified in FIG. 13. The apparatus 1 is provided with an image pickup device 10 and a processing unit 11.

Figure 2:
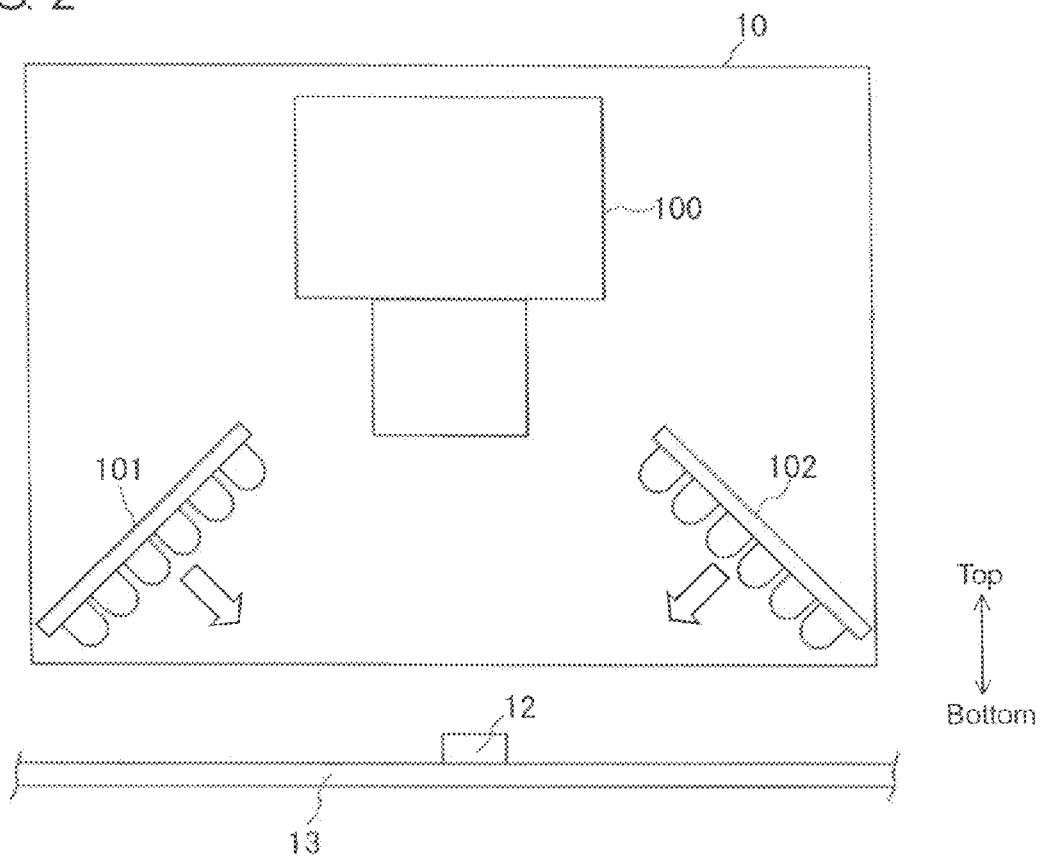
FIG. 2 is a schematic view of an image pickup device in FIG. 1.

The image pickup device 10 is a device for relatively moving a board and a camera to successively pickup images of the predetermined places on the board with or without components mounted thereat. As shown in FIG. 2, the image pickup device 10 is provided with the camera 100 and a pair of lateral or oblique illumination light sources 101, 102.

The camera 100 is a device for picking up images on each of ante-mounting, post-mounting and post-mounting operation boards 13 (which will be respectively designated hereafter as 13a, 13b and 13c from time to time for the purpose of distinguishing the boards from one another) on which components 12 are to be mounted or have been mounted. Each of the oblique illumination light sources 101, 102 is an illumination for lighting up the board 13 from obliquely above as indicated by the arrow in picking up an image by the camera 100. The oblique illumination light sources 101, 102 are arranged to throw lights toward the board 13 from obliquely above on one side and the other side.

Figure 3:
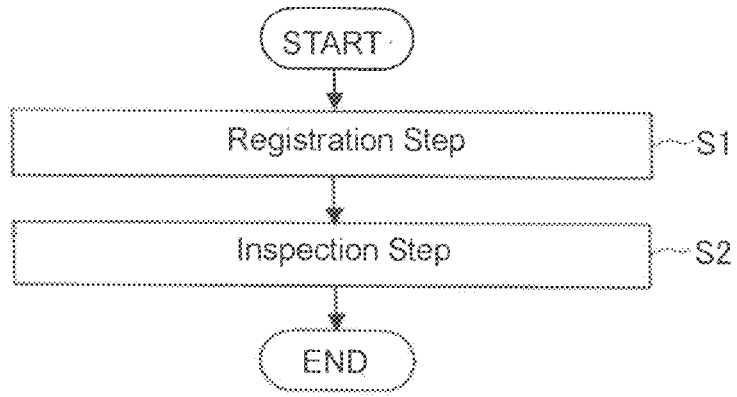
FIG. 3 is a flow chart showing a processing operation executed by a processing unit in FIG. 1.

The processing unit 11 is a device for processing the images picked up by the image pickup device 10 and for judging whether or not components are respectively mounted at predetermined places, that is, at respective scheduled or programmed target places on a board to be inspected. The processing unit 11 is composed of a CPU 110, a program memory 111 and a data memory 112. The CPU 110 together with programs stored in the program memory 111 constitutes a support vector machine. In accordance with a program stored in the program memory 111, the CPU 110 processes the images picked up by the image pickup device 10 and judges the presence/absence of a component at each predetermined place. As shown in FIG. 3, the processing unit 11 judges the presence/absence of each component through a registration step S1 and an inspection step S2.

Figure 4:
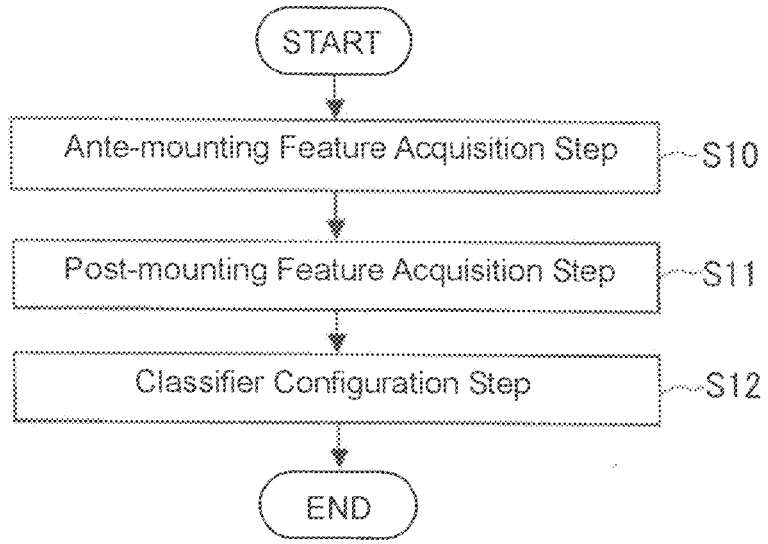
FIG. 4 is a detailed flow chart showing a registration step in FIG. 3.

First, the registration step S1 as preparation stage prior to the inspection step S2 will be described together with the operation thereat. The registration step S1 is a step of acquiring features at each of the predetermined places with and without components mounted thereat, based on the images picked up by the image pickup device 10 and of configuring a classifier by registering the acquired features of each predetermined place in the support vector machine. As shown in FIG. 4, the registration step S1 as the preparation step comprises an ante-mounting feature acquisition step S10 (ante-mounting feature acquisition means), a post-mounting feature acquisition step S11 (post-mounting feature acquisition means), and a classifier configuration step S12 (classifier configuration means).

The ante-mounting feature acquisition step S10 is a step of acquiring as ante-mounting features brightness information and area information relating to electrode areas from an ante-mounting image which the image pickup device 10 takes at each of predetermined places each being a rectangular shape where components are to be mounted, on an ante-mounting board before mounting the components at the predetermined places thereon. Here, the ante-mounting board is a first master board for classification which is used for the purpose of configuring the classifier and on which no component has been mounted at all though solder has been printed thereon.

For brevity in explanation, FIG. 12 schematically shows an example of the ante-mounting board 13a with no components mounted thereon. In FIG. 12, reference symbols P1, P2 denote predetermined places on the board 13a each indicated by a rectangular broken line, reference symbols Sp, Sp denote solder portions printed at two electrode areas of each predetermined place P1, P2 on the board 13a, and reference symbols BBa, BBa denote boundary areas which are respectively formed within the electrode areas and at opposite end parts thereof. The predetermined places P1, P2 on the ante-mounting board 13a are places known beforehand, and therefore, the relative movement between the image pickup device 10 and the ante-mounting board 13a is controlled to pickup the image (i.e., ante-mounting image) at each of the known predetermined places P1, P2. Thus, the image pickup device 10 is moved to be successively positioned right above the predetermined places P1, P2 at each of which a component is to be mounted. It is to be noted that dark-gray masks at the solder portions Sp, Sp and light-gray masks at the boundary areas BBa, BBa are for better understanding and do not depict actual or real colors or appearances thereat.

As shown in FIG. 5 in detail, at the ante-mounting feature acquisition step S10, each of the ante-mounting images taken by the image pickup device 10 is normalized (S100). Then, each of the normalized ante-mounting images is separated into a red image, a green image and a blue image (S101). Further, the separated red, green and blue images are converted into respective color intensity images for red, green and blue (S102). Then, ante-mounting features on each ante-mounting image are acquired from the red image, the green image, the blue image and the respective color intensity images (S103). The acquired ante-mounting features on each ante-mounting image are stored in the data memory 112 shown in FIG. 1.

In this particular embodiment, the ante-mounting features on each ante-mounting image include brightness information and area information relating to the electrodes areas (i.e., solder portions Sp, Sp) which are acquired from each ante-mounting image picked up.

The brightness information includes the highest brightness and the lowest brightness on an inspection area image which is made by extracting a predetermined area Ai1, Ai2 (encircling the predetermined place P1, P2 as shown in FIG. 12) from each of the picked-up images, the brightness of the boundary portions BBa, BBa at the opposite parts of the electrode areas (i.e., solder portions Sp, Sp) which are acquired from each of the picked-up images, and the brightness of a center portion BCp between the electrode areas. The highest brightness and the lowest brightness are the highest brightness and the lowest brightness on the color intensity images. The brightness of each of the boundary portions BBa, BBa at the opposite parts of the electrode areas is the brightness which is acquired at each of the boundary portions BBa within the electrode areas from the color intensity images, and includes mean red brightness, mean green brightness and mean blue brightness which are respectively acquired from the red image, green image and blue image.

The area information includes the area (square measure) of each electrode area (i.e., solder portion Sp) which is acquired from each of the picked-up images, and the major axis length and the minor axis length of an ellipse equivalent to each electrode area.

Here, the electrode areas on the ante-mounting board 13a mean pad portions (e.g., solder portions Sp, Sp) at each of which solder has been printed. The electrode areas Sp, Sp at each predetermined area P1, P2 are acquired as follows. First, areas of a predetermined rate in higher ranks which are higher in brightness are extracted from each of the picked-up images. Then, of the extracted areas, areas whose square measures are less than a predetermine rate of the total square measure of each picked-up image are excluded therefrom. Of the remaining areas, two in higher ranks which are larger in square measure are extracted as the electrode areas.

The post-mounting feature acquisition step S11 shown in FIG. 4 is also taken at the preparation stage. The post-mounting feature acquisition step S11 is a step of acquiring as post-mounting features brightness information and area information relating to the electrode areas from each of post-mounting images which the image pickup device 10 takes at the predetermined places P1, P2 of the rectangular shape, on a post-mounting board which have mounted components at the predetermined places thereon.

For brevity in explanation, FIG. 13 schematically shows an example of the post-mounting board 13b on which components 12 are mounted thereon. FIG. 13 is a fragmentary view of a part of the post-mounting board 13b which part corresponds in position to the predetermined position P1 in FIG. 12. In FIG. 13, reference symbols Ce, Ce denote electrode areas of the component 12 on the post-mounting board 13b, and reference symbols CBa, CBa denote boundary areas, which are respectively within the electrode areas Ce, Ce and at opposite end parts thereof, of the component 12 on the post-mounting board 13b. Here, the post-mounting board 13b is a second master board for classification which is also used in configuring the classifier and on which solder has been printed and all components 12 have been mounted completely and correctly at the respective predetermined places P1, P2. The post-mounting images are taken by successively positioning the image pickup device 10 right above the components 12 mounted on the post-mounting board 13b and by operating the image pickup device 10 thereat.

As shown in FIG. 6 in detail, at the post-mounting feature acquisition step S11, each of the post-mounting images picked up by the image pickup device 10 at the predetermined places P1, P2 on the post-mounting board 13b is normalized (S110). Then, each normalized post-mounting image is separated into a red image, a green image and a blue image (S111). Further, the separated red, green and blue images are converted into respective color intensity images for red, green and blue (S112). Then, post-mounting features on each post-mounting image are acquired from the red image, the green image, the blue image and the respective color intensity images (S113). The acquired post-mounting features on each post-mounting image are stored in the data memory 112 shown in FIG. 1.

The post-mounting feature acquisition step S11 is the same in processing as the ante-mounting feature acquisition step S10 though it only differs in images to be processed thereat. As shown in FIG. 13, the solder or pad portions on the post-mounting board 13b are covered by each component 12 mounted thereat, and thus, the electrodes on the post-mounting board 13b means the electrode areas Ce, Ce of each such component 12.

Figure 7:
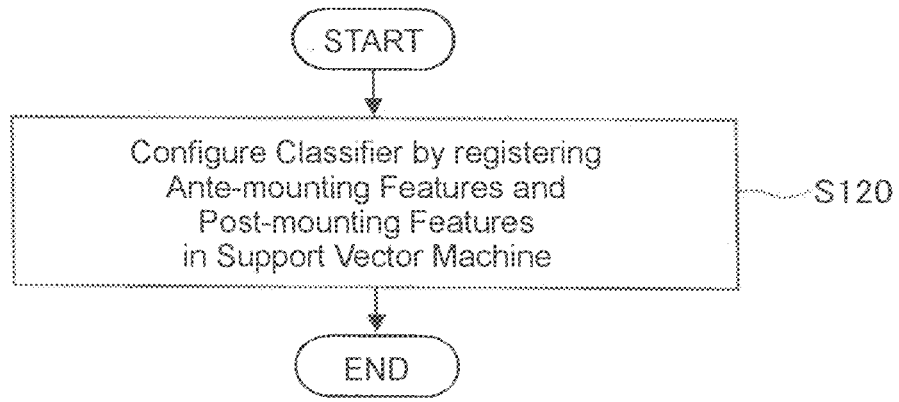
FIG. 7 is a further detailed flow chart showing a classifier configuration step in FIG. 4.

The classifier configuration step 12 shown in FIG. 4 is also included in the registration step executed at the preparation stage. As shown in FIG. 7 in detail, the classifier configuration step 12 is a step of configuring a classifier by registering in the support vector machine (i.e., CPU 110 in FIG. 1) the ante-mounting features and the post-mounting features as training data examples for respective classes. Specifically, by registering the ante-mounting features and the post-mounting features in the support vector machine, the support vector machine calculates a hyperplane which is used in separating the presence and absence of each component on an inspection board at the later-mentioned inspection step or stage, and configures the classifier.

Figure 8:
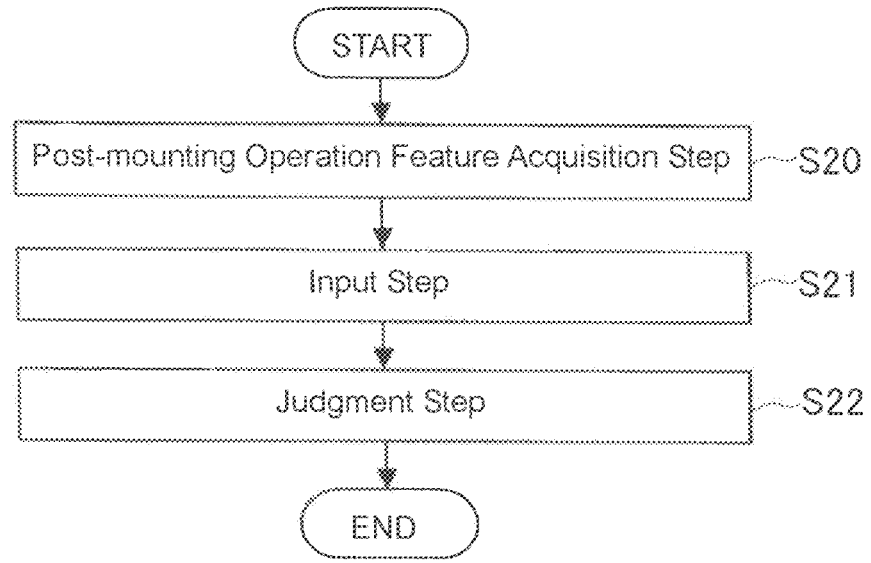
FIG. 8 is a detailed flow chart showing an inspection step in FIG. 3.

Next, the inspection step S2 will be described in detail. The inspection step S2 as actual inspection stage shown in FIG. 3 is a step of acquiring post-mounting operation features at each of the predetermined places P1, P2 on each of post-mounting operation boards (i.e., inspection boards) 13c on which component mounting operations have been completed, based on each of the images taken by the image pickup device 10 at each of the predetermined places P1, P2, of inputting the post-mounting operation features to the support vector machine configured as the classifier at the registration step S1, and of inspecting whether or not a component is mounted at each of the predetermined places on each of post-mounting operation boards (i.e., inspection boards) 13c. It is to be noted here that where all of components are completely and correctly mounted on each post-mounting operation board 13c, those components on the same take the same positions as the components 12 on the aforementioned post-mounting board (the second master board) 13b. Therefore, the following description of the post-mounting operation boards 13c to be inspected will be made also with reference to FIG. 13. As shown in FIG. 8, the inspection step S2 is composed of a post-mounting operation feature acquisition step S20 (post-mounting operation feature acquisition means), an input step S21 (input means) and a judgment step S22 (judgment means).

The post-mounting operation feature acquisition step S20 is executed after component mounting operations in which all of components have been mounted on the predetermined places P1, P2 on each inspection board 13c, and is a step of acquiring as post-mounting operation features brightness information and area information relating to the electrode areas Ce, Ce from each of post-mounting operation images which the image pickup device 10 takes at the predetermined places P1, P2 of the rectangular shape on each of the post-mounting operation boards 13c on which components 12 have been mounted at the predetermined places P1, P2 thereon. Here, each of the post-mounting operation boards 13c is a board to be inspected on which solder has been printed and components 12 have been mounted by mounting operations at the respective predetermined places P1, P2.

Figure 9:
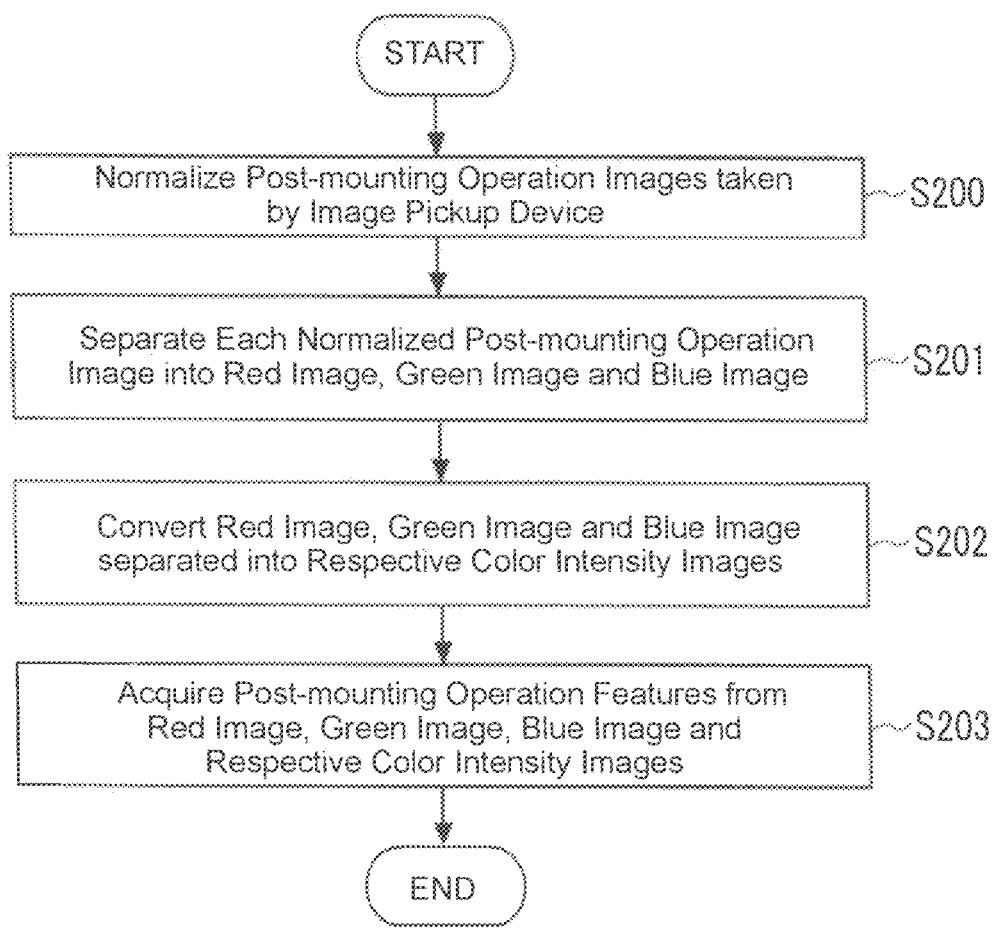
FIG. 9 is a further detailed flow chart showing a post-mounting operation feature acquisition step in FIG. 8.

As shown in FIG. 9 in detail, at the post-mounting operation feature acquisition step S20, each of the post-mounting operation images which are taken by the image pickup device 10 at the predetermined places P1, P2 on each post-mounting operation board 13c is normalized (S200). Then, each normalized post-mounting operation image is separated into a red image, a green image and a blue image (S201). Further, the separated red, green and blue images are converted into respective color intensity images for red, green and blue (S202). Then, post-mounting operation features on each post-mounting operation image are acquired from the red image, the green image, the blue image and the respective color intensity images (S203). The acquired post-mounting operation features on each post-mounting operation image are stored in the data memory 112 shown in FIG. 1.

The post-mounting operation feature acquisition step S20 is the same in processing as the ante-mounting feature acquisition step S10 though it only differs in images to be processed thereat. Where a component 12 is mounted at each of the predetermined places P1, P2 on each post-mounting operation board 13c, the electrodes of the component 12 become the electrode areas Ce, Ce at each predetermined place P1, P2. Where no component has been mounted at each of the predetermined places P1, P2, on the contrary, the pad portions Sp, Sp (shown in FIG. 12) become the electrode areas at each predetermined place P1, P2.

Figure 10:
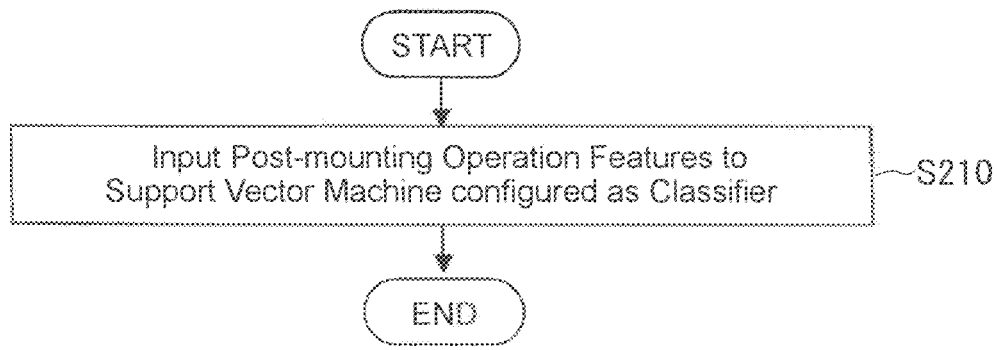
FIG. 10 is a further detailed flow chart showing an input step in FIG. 8.

The input step S21 shown in FIG. 8 is a step of inputting the acquired post-mounting operation features to the support vector machine (i.e., CPU 110 in FIG. 1) configured as the classifier, as shown in FIG. 10 in detail.

Figure 11:
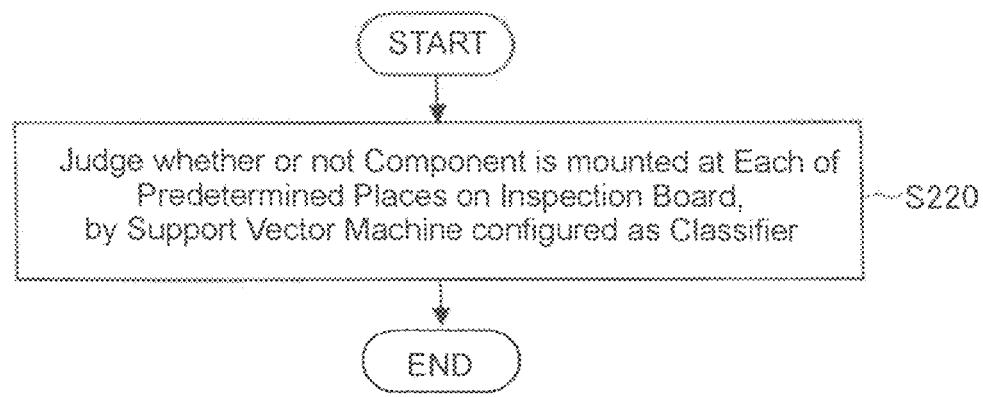
FIG. 11 is a further detailed flow chart of a judgment step in FIG. 8.

The judgment step shown in FIG. 8 is a step of judging whether or not a component 12 is mounted at each of the predetermined places P1, P2 on each post-mounting operation board 13c, by using the support vector machine which has been configured as the classifier, as shown in FIG. 11 in detail. Specifically, judgment of whether or not a component 12 is mounted at each of the predetermined places P1, P2 on each post-mounting operation board 13c is made by judging which side of the hyperplane calculated in the support vector machine the post-mounting operation features acquired from each predetermined place P1, P2 belong to. The hyperplane separates two classes: one belonging to a first category or class of the aforementioned ante-mounting features and the other belonging to a second category or class of the aforementioned post-mounting features. If the post-mounting operation features at each predetermined place P1, P2 of the post-mounting operation board 13c to be inspected belong to the first class, the absence of a component 12 at each predetermined place P1, P2 is judged, whereas if they belong to the second class, the presence of a component 12 at each predetermined place P1, P2 is judged. In this manner, judgment is made as to the present/absence of a component at each of the predetermined places P1, P2 on each post-mounting operation board 13c.

Next, advantages will be described. According to the component presence/absence judging apparatus and method in the present embodiment typically shown in FIGS. 1, 4, 7, 8 and 11-13, the classifier is configured by using the support vector machine (i.e., CPU 110), and the configured classifier judges the presence/absence of a component 12 at each of the predetermined places P1, P2 on each post-mounting operation board 13c. Therefore, after component mounting operations, it is possible to accurately judge whether or not a component 12 is mounted at each of the predetermined places P1, P2 on each post-mounting operation board 13c. Further, the support vector machine is faster to learn than neural networks or the like. Thus, it is possible to configure the classifier promptly. Accordingly, even where objects to be inspected are changed, it becomes possible to proceed to judgments promptly. Specifically, the preparation time taken to configure the classifier becomes short, so that for boards with which no data was gathered in the past, it becomes possible to configure the classifier and to proceed to judgments promptly. Further, it may be the case that even in the mounting operations for boards of the same kind, differences in production lots of boards and components cause colors and shapes to be differ inconsiderably. Even in such a case, because the support vector machine is faster to learn than neural networks or the like, it is possible to reconfigure the classifier promptly when production lots of boards and components are switched. Accordingly, it is possible to make appropriate judgments adapted for the objects to be inspected.

According to the component presence/absence judging apparatus and method in the present embodiment typically shown in FIGS. 1, 5, 6, 9, 12 and 13, the brightness information is used as features in judgments. Specifically, the brightness at the boundary portions BBa, BBa/CBa, CBa and the brightness at the center portion BCp/CCp between the electrode portions Sp, Sp/Ce, Ce are used as features. Therefore, it is possible to configure the classifier (i.e., CPU 110) which is high in accuracy of classification.

According to the component presence/absence judging apparatus in the present embodiment typically shown in FIGS. 1, and 13, the respective brightness relating to red light, green light and blue light are used as the brightness at the boundary portions BBa, BBa/CBa, CBa of the electrode areas Sp, Sp/Ce, Ce and the brightness at the center portion BCp/CCp between the electrode areas Sp, Sp/Ce, Ce. Therefore, the quantity of brightness information can be increased, and hence, it is possible to configure the classifier (i.e., CPU 110) which is higher in accuracy of classification.

According to the component presence/absence judging apparatus in the present embodiment typically shown in FIGS. 2, 12 and 13, the oblique illumination light sources 101, 102 are employed to throw lights toward the board 13 from obliquely above. Thus, it is possible to reliably acquire the brightness information relating to red light, green light and blue light.

According to the component presence/absence judging apparatus and method in the present embodiment typically shown in FIGS. 1, 5, 6, 9, 12 and 13, in addition to the brightness information, the area information relating to the electrode areas Sp, Sp/Ce, Ce is used as features on the ante-mounting board 13a, the post-mounting board 13b and each of the post-mounting operation boards 13c. Thus, the features acquired are increased, and hence, it is possible to configure the classifier (i.e., CPU 110) which is higher in accuracy of classification.

According to the component presence/absence judging apparatus and method in the present embodiment typically shown in FIGS. 1, 5, 6, 9, 12 and 13, the square measure of each electrode area Sp/Ce and a major axis length and a minor axis length of the ellipse equivalent to each electrode area Sp/Ce are used as the area information. Thus, the quantity of the information relating to the area information can be increased, and hence, it is possible to configure the classifier (i.e., CPU 110) which is higher in accuracy of classification.

Although the present embodiment takes an example that uses as the features acquired the square measure of each electrode area Sp/Ce and a major axis length and a minor axis length of the ellipse equivalent to each electrode area Sp/Ce, the present invention is not limited to doing so. The long side length and the short side length of a smallest rectangular on which each electrode area Sp/Ce is circumscribed may be used as the features acquired. Further, there may be used roundness of each electrode area Sp/Ce. Furthermore, the square measure or the like of an area to which plural electrode areas Sp, Sp/Ce, Ce on one component 12 are combined may be used instead of the square measures or the like of individual electrode areas Sp, Sp/Ce, Ce.

In the foregoing embodiment, for the purpose and convenience of distinguishing the preparation stage from the inspection stage, the ante-mounting board 13a and the post-mounting board 13b at the preparation stage have been referred to respectively as first and second master boards, whereas the post-mounting operation board 13c has been referred to as inspection board. However, the ante-mounting board 13a and the post-mounting board 13b at the preparation stage may be or may not necessarily be any particular individual boards and may be the same board. Further, neither of the ante-mounting board 13a and the post-mounting board 13b at the preparation stage may differ in kind from the post-machining operation board 13c at the inspection stage. Moreover, either of the ante-mounting board 13a and the post-mounting board 13b at the preparation stage may be one of boards in a lot, and the post-mounting operation boards 13c at the inspection stage may be the rest of the boards in the same lot.

Preferably, the presence/absence judgments of components on each of the post-mounting operation boards 13c at the inspection stage are made after all of components have been mounted on all of the boards in a lot. However, the presence/absence judgments at the inspection stage may be made each time all of components are mounted on each board of those in a lot. Alternatively, the inspection stage may be taken each time one or more components but not all are mounted on one board of those in a lot. In other words, once the preparation stage is taken in advance, the inspection stage may be taken for each component, several components or all of components on each of the post-mounting operation boards or on a lot basis of post-mounting operation boards each with all of components having been mounted thereon.

Obviously, numerous further modifications and variations of the present invention are possible in light of the above teachings. It is therefore to be understood that within the scope of the appended claims, the present invention may be practiced otherwise than as specifically described herein.

What is claimed is:

1. A component presence/absence judging apparatus for judging whether or not components are mounted at predetermined places on a board after component mounting operations which mount the components on the board, the apparatus comprising:
an image pickup device for relatively moving the board and a camera to pickup images of the predetermined places on the board;
ante-mounting feature acquisition means for acquiring at least brightness information as ante-mounting features from an ante-mounting image which the image pickup device picks up at each of the predetermined places on an ante-mounting board before mounting the components at the predetermined places thereon;
post-mounting feature acquisition means for acquiring at least brightness information as post-mounting features from a post-mounting image which the image pickup device picks up at each of the predetermined places on a post-mounting board after mounting the components at the predetermined places thereon;
classifier configuration means for configuring a classifier by registering the ante-mounting features and the post-mounting features and calculating a hyperplane in a support vector machine;
post-mounting operation feature acquisition means for acquiring at least brightness information as post-mounting operation features from a post-mounting operation image which the image pickup device picks up at each of the predetermined places on an inspection board after mounting the components at the predetermined places thereon;
input means for inputting the post-mounting operation features to the support vector machine configured as the classifier; and
judgment means for judging whether or not a component is mounted at each of the predetermined places on the inspection board, by the support vector machine configured as the classifier, by judging which side of the hyperplane calculated in the support vector machine the post-mounting operation features belong to.

2. The component presence/absence judging apparatus as set forth in claim 1, wherein the brightness information includes the highest brightness and the lowest brightness on an inspection area image which is made by extracting a predetermined area from each of the images picked up, brightness at a boundary portion of each of electrode areas acquired from each of the images picked up, and brightness at a center portion between the electrode areas.

3. The component presence/absence judging apparatus as set forth in claim 2, wherein each of the brightness information on the boundary portion of each of the electrode areas and the brightness information on the center portion between the electrode areas includes brightness relating to red light, green light and blue light.

4. The component presence/absence judging apparatus as set forth in claim 3, wherein the image pickup device has oblique illumination light sources for throwing lights toward the board from obliquely above and picks up each of the predetermined places with the oblique illumination light sources throwing the lights toward the board.

5. The component presence/absence judging apparatus as set forth in claim 1, wherein the ante-mounting feature acquisition means, the post-mounting feature acquisition means and the post-mounting operation feature acquisition means respectively acquire, in addition to the brightness information, respective area information relating to each of the electrode areas acquired from the ante-mounting image, the post-mounting image and the post-mounting operation image as the ante-mounting features, the post-mounting features and the post-mounting operation features.

6. The component presence/absence judging apparatus as set forth in claim 5, wherein the brightness information includes a square measure of each of the electrode areas and a major axis length and a minor axis length of an ellipse equivalent to each of the electrode areas.

7. A component presence/absence judging method for judging whether or not components are mounted at predetermined places on a board after component mounting operations which mount the components on the board, the method comprising:

an ante-mounting feature acquisition step of acquiring at least brightness information as ante-mounting features from an ante-mounting image which an image pickup device picks up at each of the predetermined places on an ante-mounting board before mounting the components at the predetermined places thereon;

a post-mounting feature acquisition step of acquiring at least brightness information as post-mounting features from a post-mounting image which the image pickup device picks up at each of the predetermined places on a post-mounting board after mounting the components at the predetermined places thereon;

a classifier configuration step of configuring a classifier by registering the ante-mounting features and the post-mounting features and calculating a hyperplane in a support vector machine;

a post-mounting operation feature acquisition step of acquiring at least brightness information as post-mounting operation features from a post-mounting operation image which the image pickup device picks up at each of the predetermined places on an inspection board after mounting the components at the predetermined places thereon;

an input step of inputting the post-mounting operation features to the support vector machine configured as the classifier; and a judgment step of judging whether or not a component is mounted at each of the predetermined places on the inspection board, by the support vector machine configured as the classifier, by judging which side of the hyperplane calculated in the support vector machine the post-mounting operation features belong to.

8. The component presence/absence judging method as set forth in claim 7, wherein the brightness information includes the highest brightness and the lowest brightness on an inspection area image which is made by extracting a predetermined area from each of the images picked up, brightness at a boundary portion of each of electrode areas acquired from each of the images picked up, and brightness at a center portion between the electrode areas.

9. The component presence/absence judging method as set forth in claim 7, wherein the ante-mounting feature acquisition step, the post-mounting feature acquisition step and the post-mounting operation feature acquisition step are executed to respectively acquire, in addition to the brightness information, respective area information relating to each of the electrode areas acquired from the ante-mounting image, the post-mounting image and the post-mounting operation image as the ante-mounting features, the post-mounting features and the post-mounting operation features.

10. The component presence/absence judging method as set forth in claim 9, wherein the brightness information includes a square measure of each of the electrode areas and a major axis length and a minor axis length of an ellipse equivalent to each of the electrode areas.

\* \* \* \* \*